United States Patent [19]

Heile et al.

[11] Patent Number: 5,768,562

[45] Date of Patent: Jun. 16, 1998

[54] METHODS FOR IMPLEMENTING LOGIC IN AUXILIARY COMPONENTS ASSOCIATED WITH PROGRAMMABLE LOGIC ARRAY DEVICES

[75] Inventors: Francis B. Heile, Santa Clara; David Karchmer, Sunnyvale, both of Calif.

[73] Assignee: Altera Corporation, San Jose, Calif.

[21] Appl. No.: 533,689

[22] Filed: Sep. 26, 1995

[51] Int. Cl.$^6$ .................................................. G06F 17/00
[52] U.S. Cl. .......................... 395/500; 364/490; 707/7; 707/8
[58] Field of Search .................... 395/500, 497.01, 395/497.02, 497.03, 497.04; 707/7, 8; 364/488, 489, 490, 491

[56] References Cited

U.S. PATENT DOCUMENTS

| | | | |
|---|---|---|---|
| 4,812,975 | 3/1989 | Adachi | 395/500 |
| 4,975,601 | 12/1990 | Steele | 307/465 |
| 5,099,150 | 3/1992 | Steele | 307/465 |
| 5,128,559 | 7/1992 | Steele | 307/465 |
| 5,128,871 | 7/1992 | Schmitz | 364/490 |
| 5,247,634 | 9/1993 | Cline et al. | 707/205 |
| 5,282,163 | 1/1994 | Shibata | 307/465 |
| 5,291,614 | 3/1994 | Baker et al. | 395/800.35 |
| 5,414,839 | 5/1995 | Joshi | 707/8 |
| 5,426,744 | 6/1995 | Sawase et al. | 395/375 |
| 5,465,319 | 11/1995 | Ahamed | 395/11 |
| 5,487,164 | 1/1996 | Kirchhofer | 707/7 |
| 5,550,782 | 8/1996 | Cliff et al. | 365/230.03 |
| 5,586,219 | 12/1996 | Yufik | 395/20 |

OTHER PUBLICATIONS

John L. Nichols, "A Logical Next Step for Read–Only Memories", Electronics, Jun. 12, 1967, pp. 111–113.

Floyd Kvamme, "Standard Read–only Memories Simplify Complex Logic Design", Elecronics, Jan. 5, 1970, pp. 88–95.

Albert Hemel, "Making Small ROM's [sic] Do Math Quickly, Cheaply and Easily", Electronics, May 11, 1970, pp. 104–111.

William I. Fletcher et al., "Simplify Sequential Circuit Designs", Electronic Design, Jul. 8, 1971, pp. 70–72.

Howard A. Sholl et al., "Design of Asynchronous Sequential Networks Using Read–Only Memories", IEEE Transactions on Computers, vol. C–24, No. 2, Feb. 1975, pp. 195–206.

Arnold Weinberger, "High–Speed Programmable Logic Array Adders", IBM J. Res. Develop., vol. 23, No. 2, Mar. 1979, pp. 163–178.

Yahiko Kambayashi, "Logic Design of Programmable Logic Arrays", IEEE Transactions on Computers, vol. C–28, No. 9, Sep. 1979, pp. 609–617.

*MAX+PLUS II Programmable Logic Development System; Getting Started,* Version 5.0, Altera Corporation, San Jose, CA, Jul. 1994.

*MAX+PLUS II Programmable Logic Development System; AHDL,* Version 5.0, Altera Corporation, San Jose, CA, Jul. 1994.

Primary Examiner—Kevin J. Teska
Assistant Examiner—Tyrone V. Walker
Attorney, Agent, or Firm—Fish & Neave; Robert R. Jackson; Matthew T. Byrne

[57] ABSTRACT

Methods for implementing a portion of a user's logic design in a component such as a random access memory, a read-only memory, an arithmetic logic unit, a digital signal processor, a microprocessor, or the like which is associated with programmable logic array integrated circuitry are disclosed. A candidate portion of the user's logic is identified and its logic requirements are determined and compared to the logic capabilities of the auxiliary component. If the candidate logic portion can be implemented in the auxiliary component, that may then be done. Alternatively, additional analysis may be performed prior to implementation (e.g., to make sure that it is beneficial to implement this logic portion in the auxiliary component and/or to ascertain whether it would be more beneficial to implement some other portion of the logic in the auxiliary component). The balance of the user's logic design, which is not implemented in the auxiliary component, is implemented in the basic programmable logic array integrated circuitry.

15 Claims, 8 Drawing Sheets

METHODS FOR IMPLEMENTING LOGIC IN AUXILIARY COMPONENTS ASSOCIATED WITH PROGRAMMABLE LOGIC ARRAY DEVICES

BACKGROUND OF THE INVENTION

This invention relates to programmable logic array devices, and more particularly to methods for implementing some of the logic that is implementable by such devices in general purpose, programmable, auxiliary components associated with those devices. Examples of suitable auxiliary components include random access memories ("RAMs"), read only memories ("ROMs"), arithmetic logic units ("ALUs"), digital signal processors ("DSPs"), microprocessors, biological processors, or any similar structures. An auxiliary component may be part of a programmable logic array integrated circuit device, or it may be a separate device.

To simplify and focus the following discussion, the auxiliary component will generally be assumed to be random access memory (RAM) on a programmable logic array integrated circuit device. It will be understood, however, that this is only illustrative, and that the invention is equally applicable to the various alternatives mentioned above. Also, because for most present purposes RAM and ROM are logically equivalent to one another, it will be understood that the term RAM as used herein also includes ROM.

Programmable logic array integrated circuit devices which include random access memory accessible to the user of the device have been developed as shown, for example, by Cliff et al. U.S. patent application Ser. No. 08/245,509, filed May 18, 1994, and Cliff et al. U.S. patent application Ser. No. 08/442,795, filed May 17, 1995. (Both of these applications are hereby incorporated by reference herein.) Such devices include a large number of relatively elementary, programmable, logic modules that are programmably interconnectable by a network of interconnection conductors. Each logic module is programmable to perform any of many different, relatively simple, logic functions. For example, each logic module may be programmable to form any logical combination of four inputs applied to that logic module and to produce an output signal which is indicative of that combination. The output signal of each logic module can be either registered (by a flip-flop in the logic module) or unregistered. More complex logic functions are produced by interconnecting the logic modules through the above-mentioned network of interconnection conductors. For example, the interconnection conductor network may be programmable to connect each logic module output to any of many of the logic module inputs. Computer programs exist for automatically fitting a user's logic design into such devices. An example of such a computer program is the MAX+PLUS II Programmable Logic Development System available from Altera Corporation of San Jose, Calif. A suitable computer for running this software is an IBM-compatible personal computer with an Intel-compatible 486 microprocessor and at least 16 megabytes of random access memory.

As has been mentioned, it has recently been proposed to add so-called "user RAM" to programmable logic array integrated circuit devices of the type described above. While the basic logic modules may also be implemented using blocks of random access memory, those blocks are relatively small compared to the user RAM blocks. For example, a logic module which can form any logical combination of four inputs may be implemented using a RAM block of 16 bits. The four inputs to the logic module constitute the "address" of one of these 16 bits, and the RAM block outputs the contents of the addressed bit. In contrast, the user RAM blocks shown in the above-mentioned Cliff et al. applications are much larger than these individual logic module RAM blocks. For example, the Cliff et al. applications show user RAM blocks with 64 rows and 32 columns of RAM bits. This is 2048 bits per user RAM block, as compared to only 16 bits per logic module RAM block. Much larger addresses are used to address these relatively large user RAM blocks. For example, in the case of the 64 by 32 bit user RAM blocks, five address bits are required to address one of the 32 columns and six address bits are required to address one of the 64 rows. Thus 11 address bits are required to address a particular one-bit location in a 64 by 32 bit user RAM block.

The circuitry shown in the above-mentioned Cliff et al. applications includes circuitry for allowing data to be read out of each 64 by 32 bit user RAM block with any of several different word lengths (i.e., word lengths of one bit, two bits, four bits, or eight bits). Thus each 64 by 32 bit user RAM block can be configured as a 2048 by 1 bit memory, as a 1024 by 2 bit memory, as a 512 by 4 bit memory, or as a 256 by 8 bit memory. If desired with the Cliff et al. user RAM blocks, any or all of the data applied to the RAM block, the addresses applied to the RAM block, and the data output by the RAM block can be registered in associated data-in, address, and data-out registers (flip-flops). Alternatively any or all of these registers can be bypassed so that the associated information is unregistered. All of the data-in, address, and data-out terminals of a Cliff et al. user RAM block are programmably connectable to the interconnection conductor network mentioned above in connection with the basic logic modules. Each Cliff et al. user RAM block can act as programmable ROM by programming it when the basic logic modules are programmed and thereafter preventing the user from modifying its contents (unless, of course, the whole device is reprogrammed).

It is known that logic can be implemented in RAM or ROM. See, for example, J. L. Nichols, "A Logical Next Step for Read-Only Memories," Electronics, Jun. 12, 1967, pp. 111–13. Indeed, this is what is being done in the devices shown in the above-mentioned Cliff et al. applications when the basic logic modules are implemented using 16-bit RAM blocks. Steele U.S. Pat. No. 5,128,559 also shows that RAM blocks on a programmable logic device can be used either as logic blocks or as user RAM. However, Steele teaches that all of the RAM blocks on a device should be of the same size. Steele therefore misses important advantages achieved in apparatus of the type shown in the above-mentioned Cliff et al. application in which the user RAM blocks are substantially larger than the logic module RAM blocks. Whereas an array of relatively small and simple logic modules of the type described above that are programmably interconnectable by a network of interconnection conductors can theoretically perform any logic function, such an arrangement may be relatively inefficient for some types of logic functions. For example, some logic functions may have a very large number of inputs or may require use of a very large number of logic modules with many interconnections between those logic modules. Some of these logic functions may be much more efficiently implemented in a single large RAM block, in several large RAM blocks, or in one of the other types of auxiliary components mentioned above (e.g., an ALU, a DSP, or a microprocessor). Heretofore, however, there has been no systematic way to make use of user RAM (especially user RAM blocks that are large as compared to logic module RAM blocks) or other such auxiliary components on or in association with programmable logic array devices to perform some of the logic intended for the programmable logic array device.

In view of the foregoing, it is an object of this invention to provide methods for implementing some of the logic intended for a programmable logic array device in an auxiliary component such as a relatively large RAM block on or associated with the device.

It is another object of this invention to provide methods for automatically selecting portions of logic intended for a programmable logic array device that can advantageously be implemented in an auxiliary component on or associated with the device.

SUMMARY OF THE INVENTION

In accordance with principles of the invention a programmable logic array device with a programmable auxiliary logic component on or associated with the device is provided. The logic capabilities of the auxiliary component are determined. A portion of the logic intended for the programmable logic array device is identified as a candidate for implementation in the auxiliary component. The logic requirements of the candidate logic portion are determined and compared to the logic capabilities of the auxiliary component. If the logic requirements of the candidate logic portion do not exceed the logic capabilities of the auxiliary component, the candidate logic portion may be selected for implementation in the auxiliary component. Alternatively, additional analysis may be performed on a candidate logic portion before deciding to implement that logic portion in the auxiliary component. For example, a candidate logic portion may also be eliminated from further consideration for implementation in the auxiliary component if it is determined that implementing that portion of the logic in the auxiliary component (rather than in the basic programmable logic array) would not improve the overall utilization of the apparatus. For example, the degree of utilization of the basic programmable logic array resources, with all of the logic implemented in the basic logic array, may be determined and compared to the degree of utilization of resources with the candidate logic portion implemented in the auxiliary component and the remainder of the logic implemented in the basic logic array. If resources utilization (e.g., logic array area or speed) is not improved by implementing the candidate logic portion in the auxiliary component, that candidate logic portion may be rejected.

The methods of this invention may also include comparing the benefits of implementing each of several different candidate logic portions in the auxiliary component, and selecting the most beneficial candidate as the one to be implemented in that way.

The methods of this invention may include automated identification of candidate logic portions.

The methods of this invention may include automatically implementing the finally selected logic portion in the auxiliary component.

Further features of the invention, its nature and various advantages will be more apparent from the accompanying drawings and the following detailed description of the preferred embodiments.

DETAILED DESCRIPTION OF THE PREFERRED EMBODIMENTS

Figure 1A:
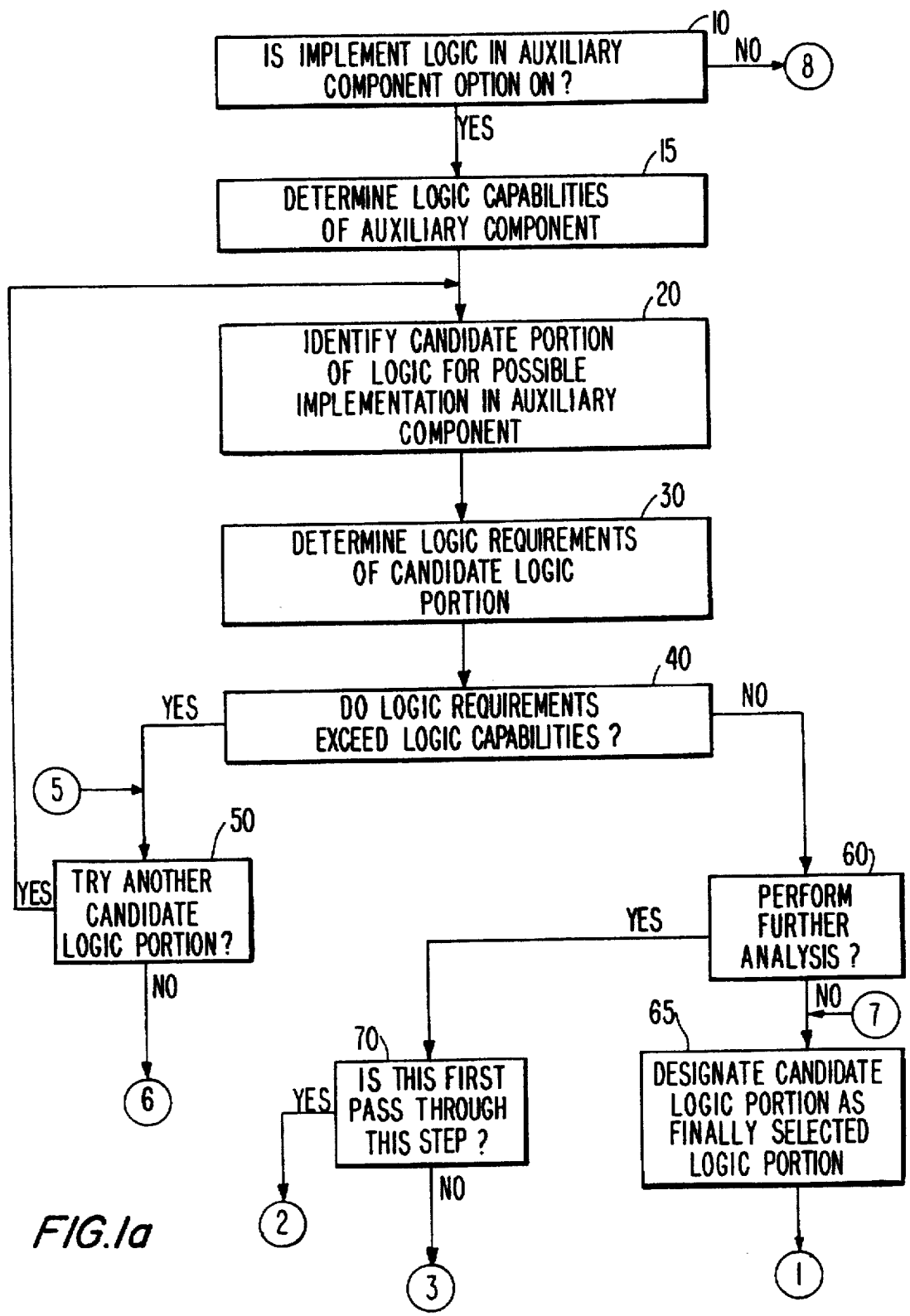
FIGS. 1a–1d (collectively referred to as FIG. 1) are a flow chart of illustrative embodiments of the methods of this invention.
Figure 1B:
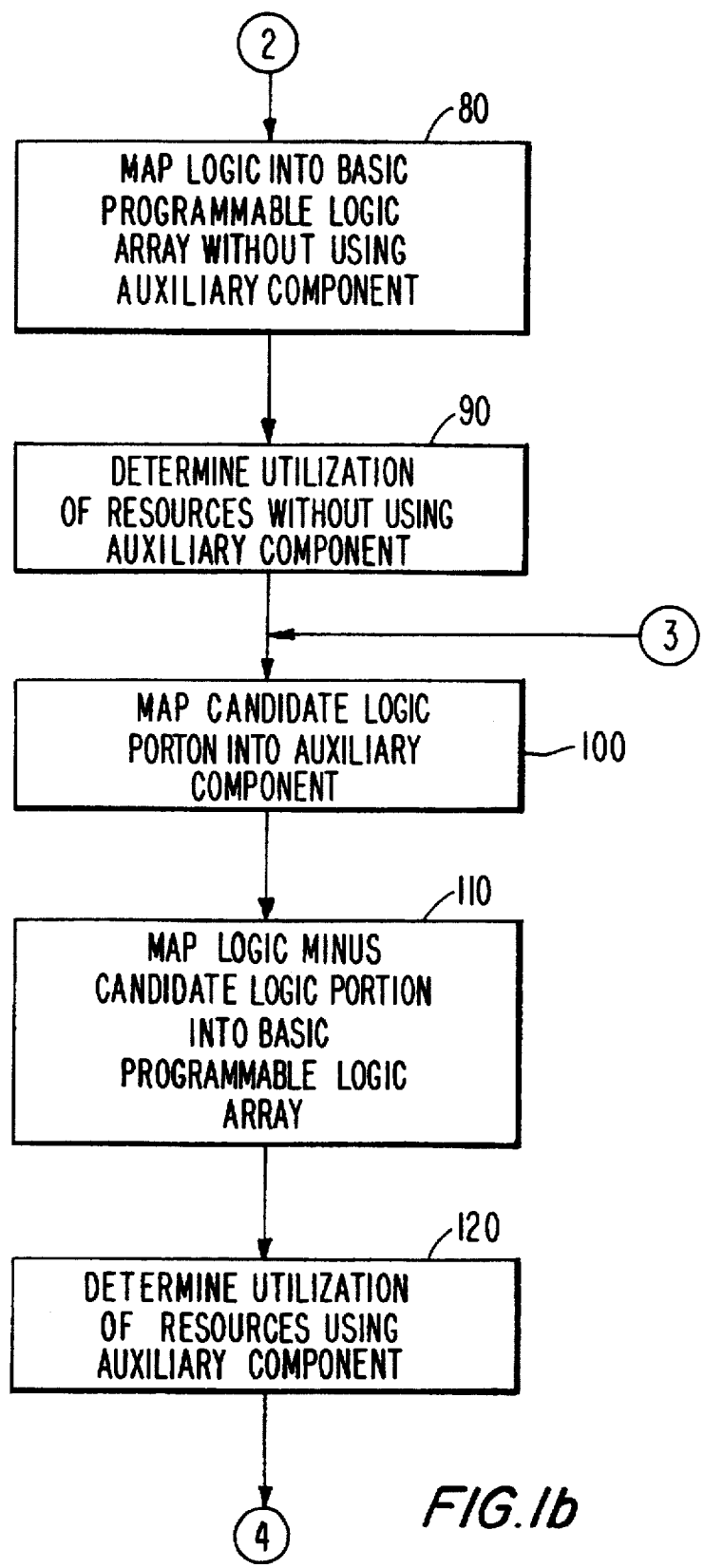
Figure 1C:
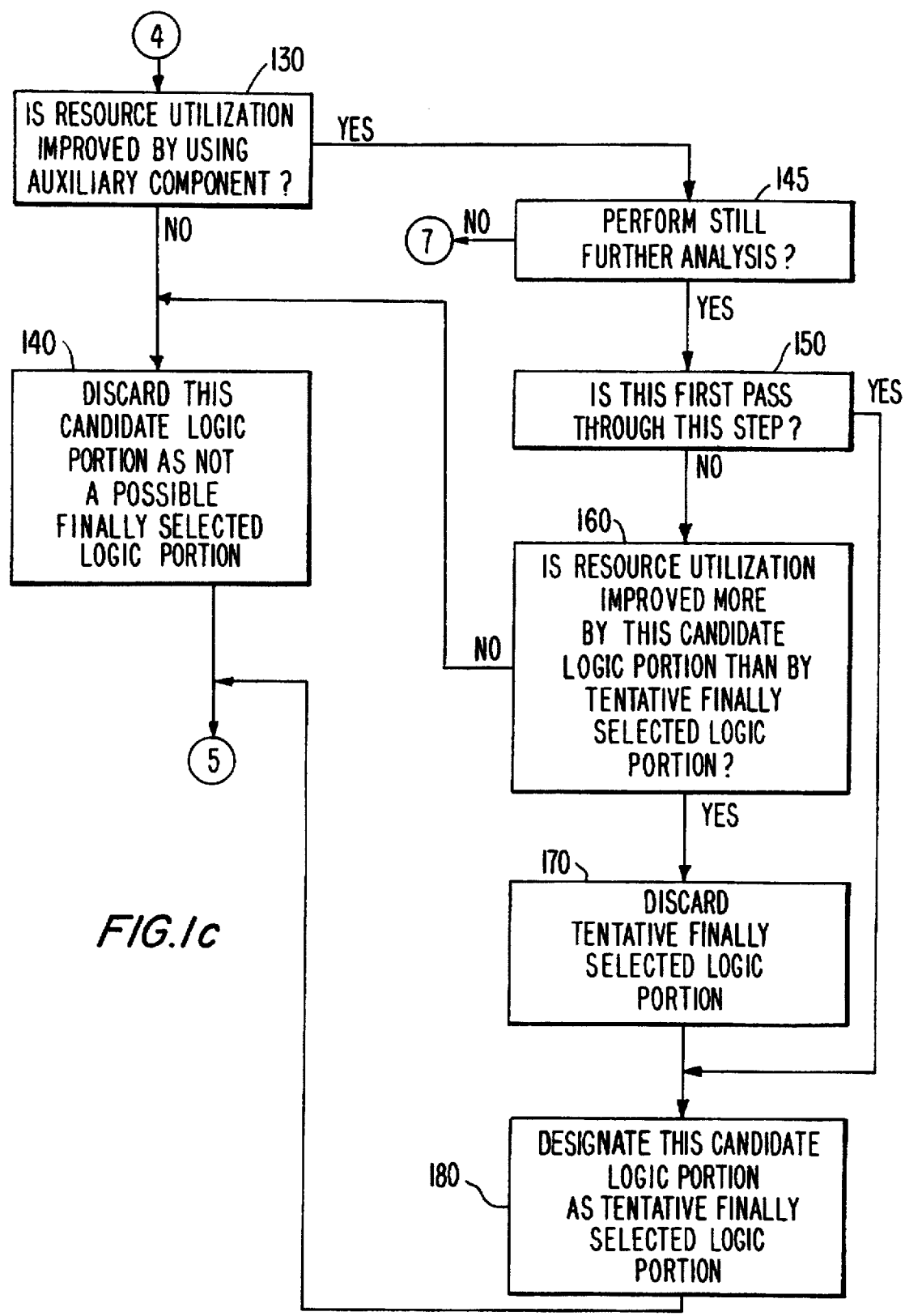
Figure 1D:
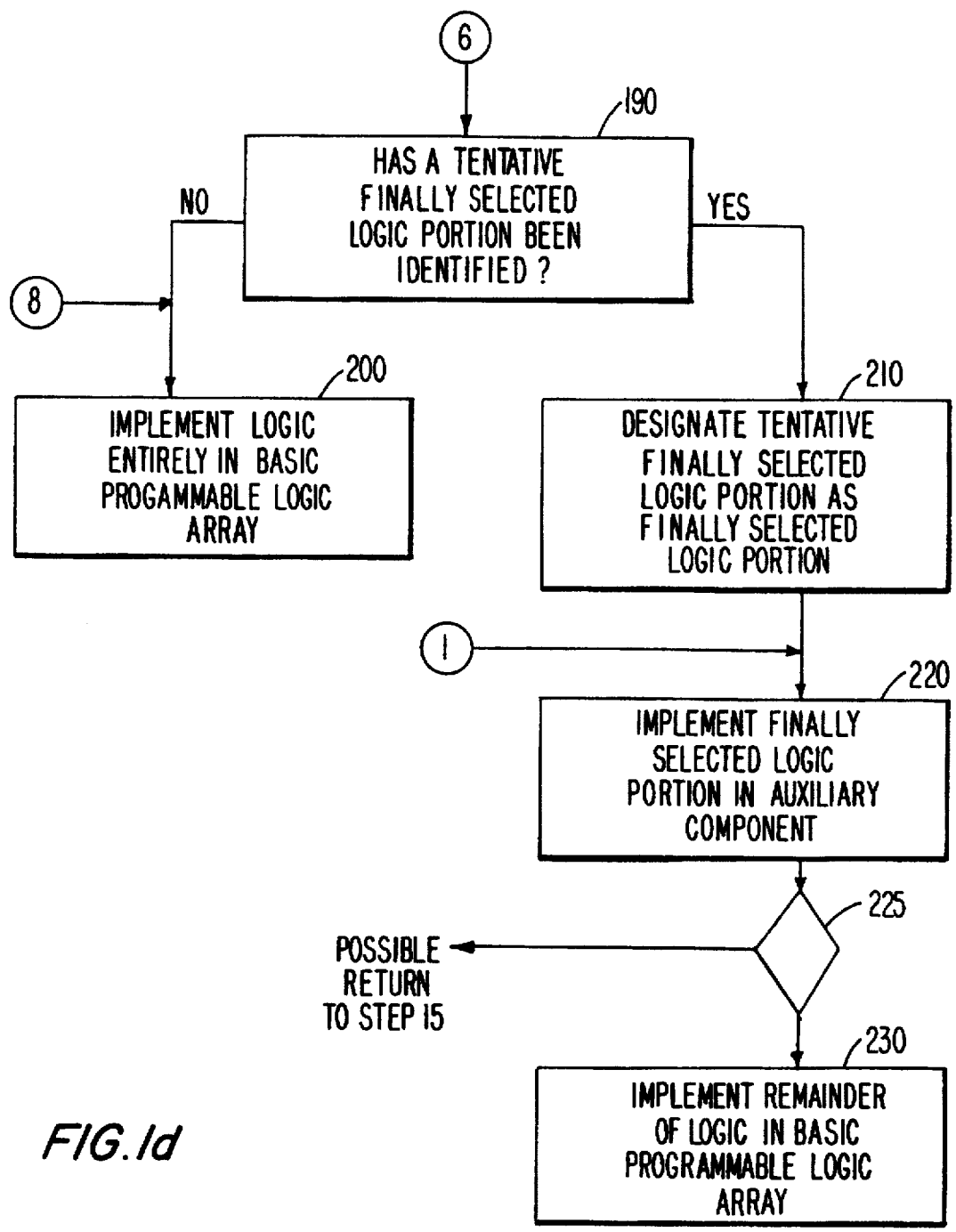

In the illustrative embodiments of the invention shown in FIG. 1 a typical first step 10 is to determine whether an "Implement Logic in Auxiliary Component" option in the software that implements the methods of this invention is "on" (i.e., has been requested by the user of the software or has been automatically selected by the software and not turned off by the user). If this option is on, control passes from step 10 to step 15. Otherwise control passes from step 10 to step 200 where the user's entire logic design is implemented in the conventional way in the basic programmable logic array without making use of the auxiliary component for any portion of the logic design.

Assuming that the "Implement Logic in Auxiliary Component" option is "on", then in step 15 the logic capabilities of the auxiliary component that is available with the basic programmable logic array are determined. In the case of programmable logic array devices of the type shown in the above-mentioned Cliff et al. applications, the auxiliary component is the user RAM blocks 410 shown, for example, in FIGS. 21 and 22 or the similar structure shown in FIG. 24 of the '509 application, or the user RAM blocks 40 shown, for example, in FIGS. 1, 2, and 7 of the '795 application. For an auxiliary component of this type, step 15 may include such substeps as determining the size(s) of the auxiliary component and whether it has input and/or output registers. For example, if only one user RAM block in the Cliff et al. apparatus is to be considered as an auxiliary component, it has several possible input and output configurations. These include (1) eight inputs and eight outputs (configured as a 256 by 8 bit RAM), (2) nine inputs and four outputs (configured as a 512 by 4 bit RAM), (3) ten inputs and two outputs (configured as a 1024 by 2 bit RAM), or (4) 11 inputs and one output (configured as a 2048 by 1 bit RAM). The possible input and output configurations also include registered or unregistered input and output. If multiple user RAM blocks in the Cliff et al. apparatus are considered collectively to be an auxiliary component, then the range of input and output options becomes even greater. For example, a 12 input, one output macrofunction can use two user RAM blocks fed by 11 of the inputs and a two-to-one switch elsewhere on the device (e.g., in a basic logic module) controlled by the 12th input to select which of the two user RAM block outputs to use. Again, if multiple user RAM blocks are to be considered collectively as the auxiliary component, a more exhaustive list of the possible input and output configurations of the auxiliary component is provided in Table 3 of the '795 application.

If the auxiliary component is something other than RAM (e.g., an ALU or a DSP), then step 15 includes the substeps that are appropriate for determining the logic capabilities of these other types of logic structures.

In step 20 a portion of the user's logic is identified as a candidate for implementation in the auxiliary component. This choice of a candidate logic portion may be partly manual or it may be made automatically by software of which the FIG. 1 method steps are a part. For example, if the selection of a candidate logic portion is partly manual, the software may permit the user to draw a boundary line around or to highlight any portion of the logic that the user thinks may be suitable for implementation in the auxiliary component. Automatic selection of a candidate logic portion may be based on the hierarchy of the user's logic design. For example, the software may start at the lowest level or levels in the user's logic design and (using the steps discussed in succeeding paragraphs) attempt to implement that low level portion of the logic in the auxiliary component. If no low level portion is thus implementable, the process stops. On the other hand, if one or more low level portions is implementable in the auxiliary component, then additional increments of logic up the hierarchy may be added to each such low level portion until the capacity of the auxiliary component is reached. The resulting portion of logic which best utilizes the resources of the auxiliary component may be selected as the portion to be implemented in that component.

Step 30 is performed on the candidate logic portion identified in step 20. In step 30 the logic requirements of the candidate logic portion are determined. For example, the number of inputs is determined, the number of outputs is determined, and whether or not the candidate logic portion includes any registers (flip-flops) is determined.

In step 40 the logic requirements of the current candidate logic portion (determined in step 30) are compared to the logic capabilities of the auxiliary component (determined in step 15). For example, the required numbers of inputs and outputs may be compared to the available numbers of inputs and outputs. Also, if registers are needed by the candidate logic portion, the availability of registers of an appropriate type in the auxiliary component is considered. If the logic requirements of the current candidate logic portion exceed the logic capabilities of the auxiliary component, control passes from step 40 to step 50, which leads to elimination of the candidate logic portion from further consideration for implementation in the auxiliary component. On the other hand, if the logic requirements of the candidate logic portion do not exceed the logic capabilities of the auxiliary component, control passes from step 40 to step 60, which leads to continued consideration of the candidate logic portion for possible implementation in the auxiliary component.

As a further specific example of step 40, if the auxiliary component is a user RAM block of the type described in the above-mentioned Cliff et al. applications, the number of inputs and the number of outputs required by the candidate logic portion are respectively compared to the number of inputs and the number of outputs available with any of the possible configurations of the user RAM block. For example, if the required number of inputs is eight or less and the required number of outputs is also eight or less, the candidate logic portion can be implemented in the auxiliary component, and control passes from step 40 to step 60. On the other hand, if the required number of outputs is more than eight, the candidate logic portion cannot be implemented in the auxiliary component and control passes from step 40 to step 50. (Note, however, that if the auxiliary component is two or more Cliff et al. user RAM blocks, then the auxiliary component may have more than eight outputs. Thus it may be desirable to test a candidate logic portion against several possible available auxiliary component configurations or structures.) If the required number of inputs is nine and the required number of outputs is four or less, then again the candidate logic portion can be implemented in a Cliff et al. user RAM block and control passes from step 40 to step 60. But if the number of outputs required with nine inputs is more than four, the candidate logic portion cannot be implemented in a Cliff et al. user RAM block and control passes from step 40 to step 50. (As noted in the preceding parenthetical, more outputs can be made available if the auxiliary component can be two or more Cliff et al. user RAM blocks.) All the possible configurations of the inputs and outputs of the Cliff et al. user RAM block are tested until one is found that is not exceeded by the input and output requirements of the candidate logic portion (control then passing to step 60) or until it is found that none of the possible configurations is sufficient for the input and output requirements of the candidate logic portion (control then passing to step 50).

Figure 2:
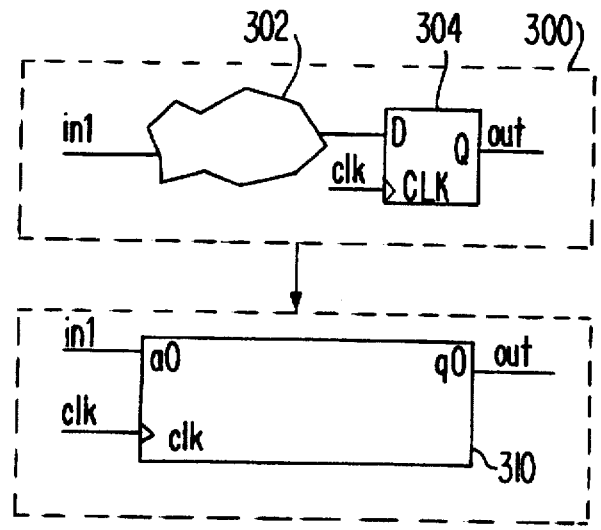
FIG. 2 is a simplified block diagram showing mapping of an illustrative portion of a user's logic design into an illustrative auxiliary component.
Figure 3:
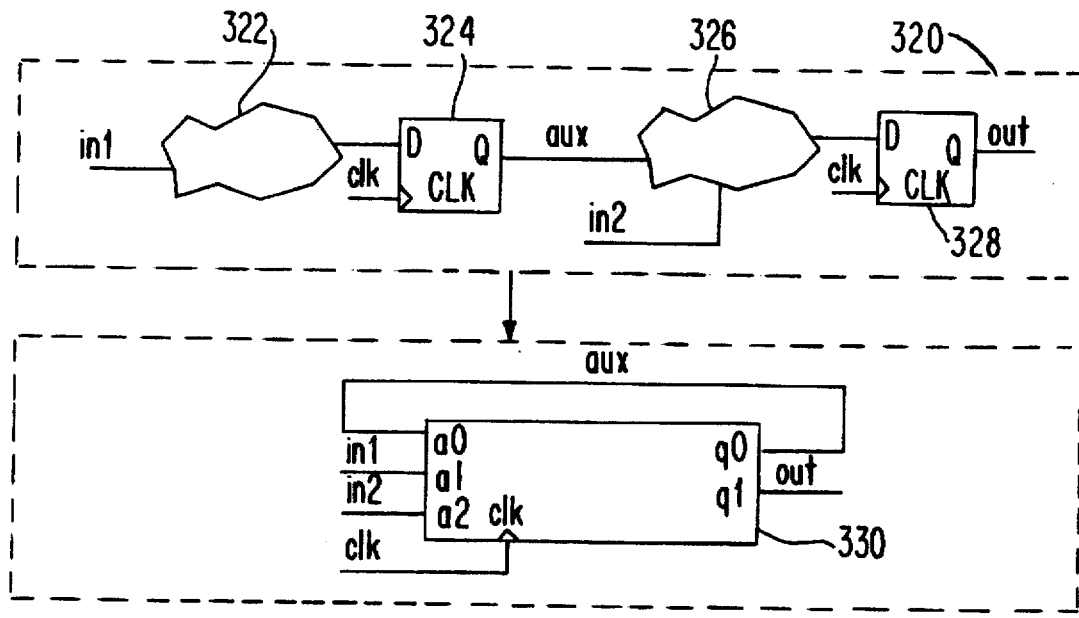
FIG. 3 is a simplified block diagram similar to FIG. 2 showing mapping of a somewhat more complex illustrative portion of a user's logic design into an illustrative auxiliary component.

Continuing with this specific example, if the candidate logic portion requires registers that match the capabilities of the input or output registers in the Cliff et al. user RAM blocks, the need for registers can be satisfied by those RAM blocks. Even a buried register inside a candidate logic portion can be implemented in a Cliff et al. user RAM block by moving the register to an output and feeding that output back into the RAM block as an input. These principles are illustrated in FIGS. 2 and 3. FIG. 2 shows mapping of logic 300 (including combinatorial logic 302 and an output register 304) into a user RAM block 310 with output registers (e.g., a user RAM block of the type shown in the Cliff et al. applications). FIG. 3 similarly shows mapping of somewhat more complicated logic 320 (including combinatorial logic groups 322 and 326 with a buried register 324 and an output register 328) into a user RAM block 330 with output registers (e.g., again a user RAM block of the type shown in the Cliff et al. applications). As described in general terms above, buried register 324 is moved to a registered output qo of RAM block 330 and its output is fed back to an input of the RAM block. Buried registers may thus increase the input and output requirements of a candidate logic portion such as 320, and this must be taken into account in step 40.

Returning to FIG. 1, when control passes to step 50 a decision is made as to whether or not to try another candidate logic portion for possible implementation in the auxiliary component. This decision may be partly manual, with the user of the software that includes the FIG. 1 method steps being given the option to chose whether or not another candidate logic portion will be tried. Or the decision may be automatic, with the software itself automatically going on to try another candidate logic portion if there are any as-yet-untried portions. If the decision is made to try another candidate logic portion, control passes from step 50 back to step 20 to repeat the above-described steps for another candidate logic portion. On the other hand, if a decision is made not to try another candidate logic portion (or if all possible candidates have been tried), control passes from step 50 to step 190.

Step 190 determines whether a candidate logic portion has been found which can be implemented in the auxiliary component. (As will be seen from the following discussion of other FIG. 1 steps, a candidate logic portion (if any) which has been selected for such implementation is known as the "tentative finally selected logic portion" when step 190 is reached.) If no tentative finally selected logic portion has been identified when step 190 is reached, control passes from step 190 to step 200, where the entire logic design is implemented in the conventional way in the basic programmable logic array resources without using the auxiliary component. On the other hand, if a tentative finally selected logic portion has been identified, control passes from step 190 to step 210, where the tentative logic portion selection is made final. Then in step 220 the finally selected logic portion is implemented in the auxiliary component, and in step 230 the remainder of the logic design is implemented in the conventional way in the basic programmable logic array resources.

If the system includes more than one auxiliary component, step 225 may be included between steps 220 and 230 to send control back to step 15 to attempt to implement other portions of the logic in the other auxiliary component(s). Step 230 is performed after any such iterations have been completed.

Returning to step 60, a decision is made there as to whether or not a candidate logic portion which was found (in step 40) to be implementable in the auxiliary component should be subjected to further analysis before being accepted as the logic portion to be actually implemented in the auxiliary component. If not, step 65 is performed to designate the candidate logic portion as the finally selected logic portion. Control then passes to already described steps 220 and 230, where the selected logic portion is implemented in the auxiliary component and the remaining logic is implemented in the basic programmable logic array. The decision called for in step 60 can be partly manual (with the user of the software being given the choice as to whether or not more analysis to be performed or an implementable candidate logic portion simply implemented) or automatic (with the software being set up in advance to always pass control from step 60 to either step 65 or step 70).

If more analysis is to be performed on a candidate logic portion, control passes to step 70, in which a determination is made as to whether this is the first time step 70 has been reached. If so, steps 80 and 90 are performed. If not, steps 80 and 90 will already have been performed and the results saved so that these steps can now be skipped and step 100 performed next.

In step 80 the user's entire logic design is mapped, for reference, into the basic programmable logic array in the conventional way without using the auxiliary component for any portion of the logic design. In step 90 the degree of utilization of the basic logic array resources that results from the performance of step 80 is determined. For example, step 90 may include such substeps as determining how many logic modules in the logic array are used, how many interconnection conductors in the logic array are used, what the anticipated speed of the logic will be, etc. This information is saved for use in subsequent performance(s) of step 130.

In step 100 the candidate logic portion is mapped into the auxiliary component. FIG. 2 shows an example of such mapping of logic portion 300 into auxiliary component 310, and FIG. 3 shows another example of such mapping of logic portion 320 into auxiliary component 330.

In step 110 the user's logic design, minus the candidate logic portion, is mapped into the basic programmable logic array. This is similar to step 80 but for somewhat less logic because the candidate logic portion is not included.

In step 120 the degree of utilization of circuit resources that results from steps 100 and 110 is determined. For example, step 120 may include substeps similar to those mentioned above in connection with step 90, but for the different circuit mapping performed in steps 100 and 110.

In step 130 the resource utilizations determined in steps 90 and 120 are compared. If resource utilization is not sufficiently improved from step 90 to step 120, control can be passed from step 130 to step 140, which leads to the current candidate logic portion being eliminated from further consideration. Control then returns to step 50, which has already been discussed. On the other hand, if step 130 indicates that resource utilization is improved by implementing the current candidate logic portion in the auxiliary component, then control passes from step 130 to 145.

Step 145 is similar to step 60 and it may be performed either partly manually or automatically as described above in connection with step 60. If it is desired to merely accept the current candidate logic portion for implementation in the auxiliary component, control passes from step 145 to step 65, which has already been discussed. On the other hand, if still further analysis of the circuitry is desired to search for another candidate logic portion which can be even more advantageously implemented in the auxiliary component, then control passes from step 145 to step 150.

Step 150 is performed to bypass steps 160 and 170 until after a first candidate logic portion has been designated (in step 180) as the tentative finally selected logic portion. After a first performance of step 180, control passes to step 50, where it will be decided whether to try another, as yet untried, candidate logic portion, beginning again with step 20. Step 150 will be reached again for each successive candidate logic portion that does not exceed the logic capabilities of the auxiliary component (step 40) and that does improve resource utilization when that candidate logic portion is implemented in the auxiliary component (step 130). During each subsequent pass through the steps following step 150, step 160 will be performed to compare the resource utilization improvement associated with implementing the tentative finally selected logic portion in the auxiliary component with the resource utilization improvement associated with implementing the current candidate logic portion in the auxiliary component. (The resource utilization improvements compared in step 160 are from performances of step 130.) If the current candidate logic portion does not offer greater improvement than the tentative finally selected logic portion, control passes from step 160 to step 140, where the current candidate logic portion is eliminated from further consideration. From step 140 control passes back to step 50 as described above. On the other hand, if step 160 indicates that implementing the current candidate logic portion in the auxiliary component will be more advantageous than implementing the tentative finally selected logic portion in that component, then control passes from step 160 to step 170. In step 170 the current tentative finally selected logic portion is discarded, and then in step 180 the current candidate logic portion is designated as the new tentative finally selected logic portion.

From the foregoing it will be seen that repeated performance of the steps following step 150 ultimately leads to the selection (as the tentative finally selected logic portion) of the logic portion which is most advantageously implemented in the auxiliary component. When there are no more candidate logic portions to try, control passes from step 50 to step 190, which has already been fully discussed above and which (with step 200 or steps 210, 220, and 230) leads to an appropriate implementation of the user's logic design in the circuitry.

As a possible alternative to some of the foregoing, once a tentative finally selected logic portion has been identified, step 130 can be eliminated for subsequent candidate logic portions. Instead, only a step like step 160 is needed to compare resource utilization for each new candidate logic portion to resource utilization for the current tentative finally selected logic portion. If the candidate logic portion offers improved resource utilization as compared to the current tentative finally selected logic portion, the candidate logic portion becomes the new tentative finally selected logic portion. Otherwise that candidate logic portion is rejected.

Figure 4:
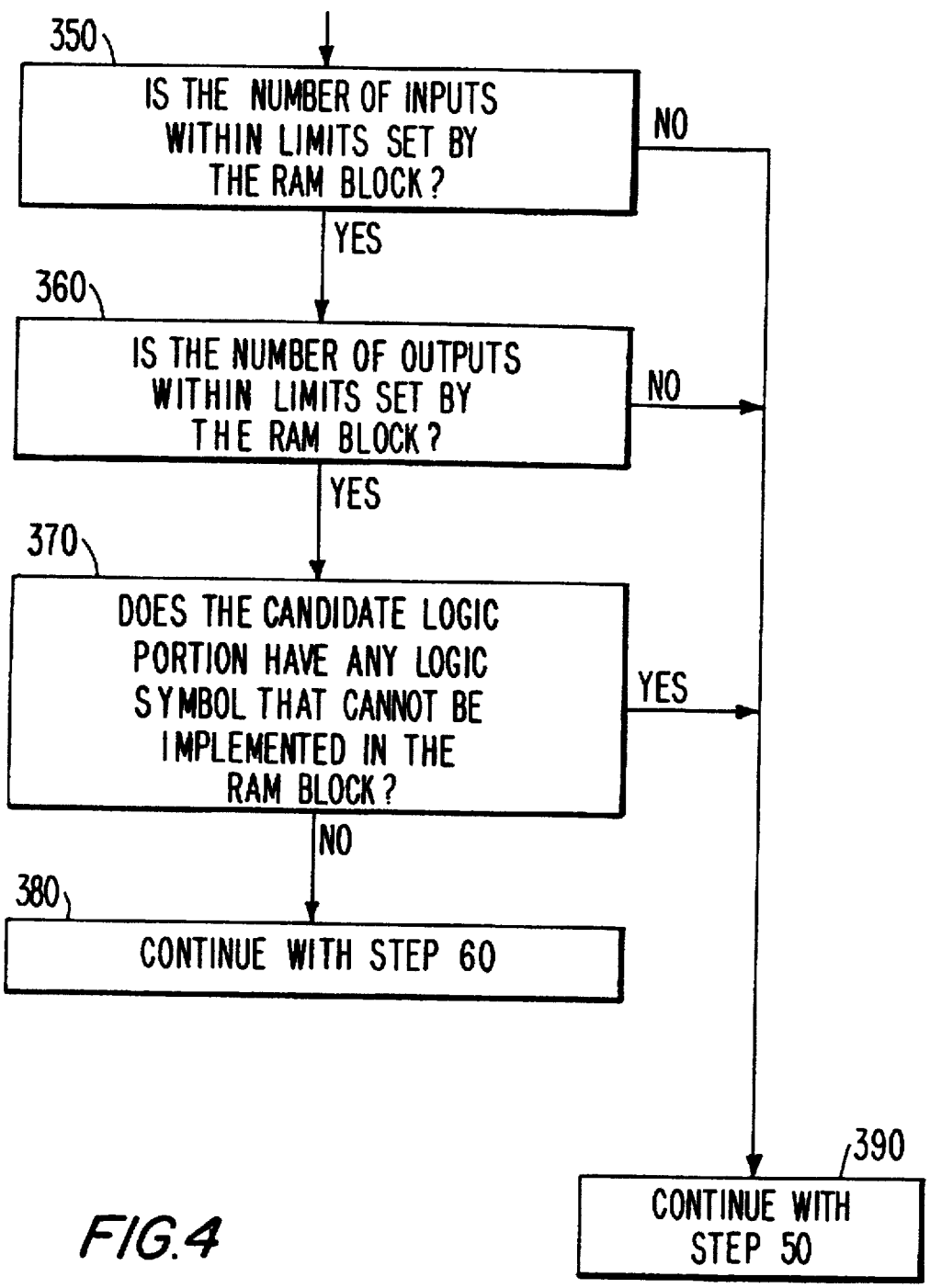
FIG. 4 is a flow chart showing an illustrative embodiment of a portion of the FIG. 1 flow chart in somewhat more detail.

FIG. 4 shows an example of how step 40 in FIG. 1 can be carried out in the case that the auxiliary component is a block of RAM (e.g., as shown in the above-mentioned Cliff et al. applications). In step 350 the number of inputs required by the candidate logic portion is compared to the number of available RAM block inputs. (The upper limit or limits for number of RAM block inputs have been discussed above. In addition, a lower limit may be set to preclude selection of some relatively small and therefore presumably simple portion of logic for implementation in the auxiliary component.) If the required number of inputs is within the limits of the available inputs, control passes from step 350 to step 360 for further consideration of the candidate logic portion. Otherwise control passes from step 350 to step 390, leading to rejection of the candidate logic portion.

In step 360 the number of outputs required by the candidate logic portion is compared to the number of available RAM block outputs. If the required number of outputs is within the limits of the available outputs, control passes from step 360 to step 370 for further consideration of the candidate logic portion. Otherwise control passes to step 390, which leads to rejection of the candidate logic portion.

In step 370 logic symbols such as flip-flops in the candidate logic portion are considered to make sure there are none that cannot be implemented in the RAM block (e.g., by the input or output flip-flops of the RAM block). For example, any flip-flops used in the candidate logic portion must be of types that can be implemented by the RAM block flip-flops. If all logic symbols in the candidate logic portion can be implemented in the RAM block, control passes from step 380, leading to further processing of the candidate logic portion. On the other hand, if any logic symbol in the candidate logic portion cannot be implemented in the RAM block, control passes from step 370 to step 390, which leads to rejection of the candidate logic portion.

Figure 5:
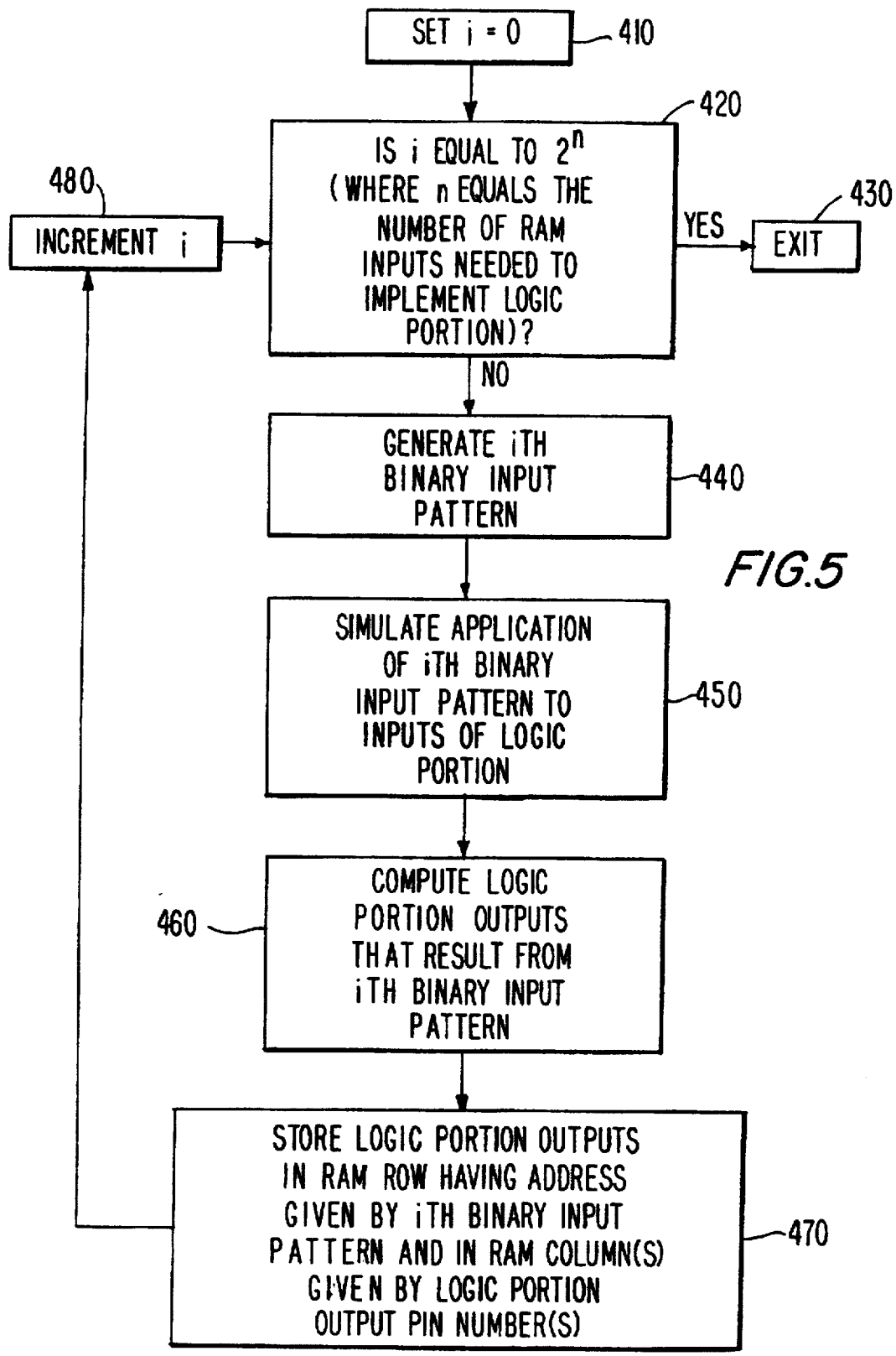
FIG. 5 is a flow chart showing an illustrative embodiment of another portion of the FIG. 1 flow chart in somewhat more detail.

FIG. 5 shows an example of how step 220 in FIG. 1 can be carried out in the case that the auxiliary component is a block of RAM (e.g., as shown in the above-mentioned Cliff et al. applications). In step 410 an index parameter i is initialized to zero. In step 420 i is tested for equality to $2^n$, where n is the number of inputs needed to implement the selected logic portion in the RAM block. If i is equal to $2^n$, control passes to step 430 where processing in accordance with FIG. 5 ends. If i is not yet equal to $2^n$, control passes to step 440.

In step 440 the ith pattern of the binary inputs to the selected logic portion is generated. For example if the selected logic portion has six inputs and i is currently zero, the ith pattern of the binary inputs may be 000000. If i is currently one, the ith pattern of the binary inputs may be 000001. When i is two, the ith pattern of inputs may be 000010. This progression may continue during successive performances of step 440 until, when i is 63, the ith pattern may be 111111.

In step 450 application of the ith binary input pattern to the n input terminals of the selected logic portion is simulated so that in step 460 the resulting selected logic portion outputs can be determined. Continuing with the foregoing example, if the selected logic portion has three outputs which are 110 when the inputs are 000000, then performance of steps 450 and 460 for inputs 000000 yields outputs 110. If the selected logic portion has outputs 101 when its inputs are 000001, then performance of steps 450 and 460 for inputs 000001 yields outputs 101.

In step 470 the outputs determined in step 460 are stored at the RAM address given by the ith binary input pattern. Continuing on with the foregoing example, step 460 stores the values 110 in three columns of the RAM at row address 000000. On another pass through step 460 when the input pattern is 000001, the values 101 are stored in the same three columns of the RAM at row address 000001. There is a one-for-one correspondence between the selected logic output pin numbers and the columns in which the individual output bits (from step 460) are stored in accordance with step 470.

In step 480 i is incremented and control returns to step 420 for possible repetition of steps 440 et seq. for the next binary input pattern.

The methods of this invention can be implemented using a suitably programmed, general purpose digital computer such as the one mentioned in the Background section of this specification. Indeed, the methods of this invention can be carried out by adding suitable program steps to the Altera software mentioned in the Background section.

It will be understood that the foregoing is only illustrative of the principles of the invention, and that various modifications can be made by those skilled in the art without departing from the scope and spirit of the invention. For example, various portions of the FIG. 1 flow chart are optional and can be eliminated if it is not desired to perform the analyses provided by those flow chart portions. FIG. 1 includes bypasses of some of these optional portions such as the bypass that begins with the negative outcome from step 60, and the bypass that begins with the negative outcome from step 145.

As another example of modifications within the scope of this invention, many different types of auxiliary components have been mentioned as possibilities. These include RAMs, ROMs, ALUs, DSPs, and other components capable of implementing logic.

Figure 6:
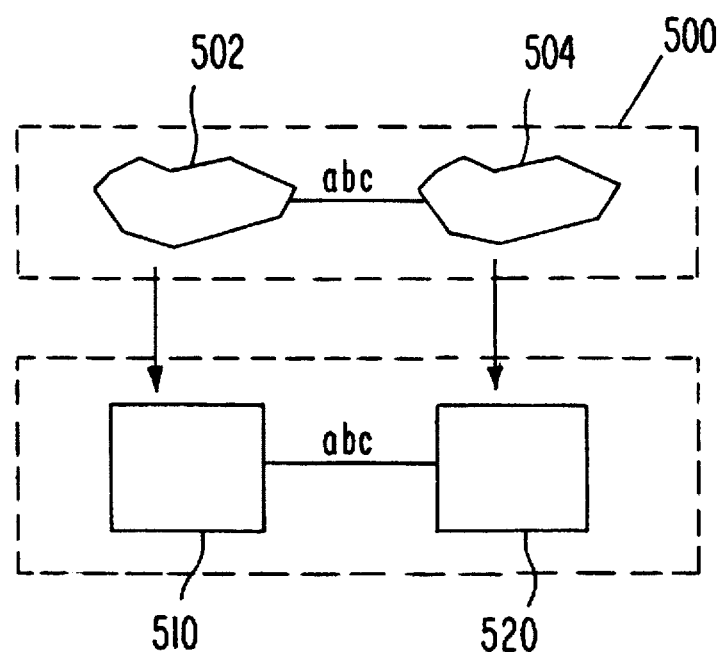
FIG. 6 is another simplified block diagram similar to FIGS. 2 and 3 showing implementation of a user's logic design in programmable logic array integrated circuitry and an associated auxiliary component.

As still another example of modifications within the scope of this invention, it has been mentioned that the auxiliary component can either be part of the programmable logic array integrated circuit (as in the case of the user RAM blocks in the above-mentioned Cliff et al. applications), or the auxiliary component can be separate circuitry. As an example of this latter possibility, FIG. 6 shows the result of using the methods of this invention to implement a user's logic design 500 partly in a field programmable gate array ("FPGA") 510 and partly in a separate ROM 520. The methods of this invention are used to identify the portion 504 of the user's logic that is advantageously implemented in ROM 520. That portion of the logic is accordingly implemented in the ROM, while the remaining portion 502 is implemented in FPGA 510. The methods of this invention are thus equally applicable to use of auxiliary components that are either part of or separate from the basic programmable logic device(s).

The invention claimed is:

1. A method for selecting a portion of a user's logic design for implementation in a component which is auxiliary to programmable logic array integrated circuitry in which a remainder of said user's logic design other than said portion is to be implemented, said method comprising the steps of:

identifying a candidate portion of said user's logic design for possible implementation in said auxiliary component;

determining logic requirements of said candidate portion;

comparing the logic requirements of said candidate portion to logic capabilities of said auxiliary component;

selecting said candidate portion for possible implementation in said auxiliary component if said logic requirements are within said logic capabilities; and implementing no portion of said user's logic design in said auxiliary component and implementing said candidate portion in said programmable logic array integrated circuitry, if said logic requirements of said candidate portion are not within said logic capabilities.

2. The method defined in claim 1 further comprising the steps of:

if said candidate portion is selected in said selecting step, then implementing said candidate portion in said auxiliary component and implementing a balance of said user's logic design other than said candidate portion in said programmable logic array integrated circuitry; and if no portion of said user's logic design is implemented in said implementing step, then implementing said user's logic design in said programmable logic array integrated circuitry.

3. The method defined in claim 2 wherein said auxiliary component includes a RAM having a plurality of data storage locations addressed for data storage and retrieval by signals applied to a plurality of address terminals of said RAM, wherein said candidate portion produces at least one logic signal output in accordance with a predetermined logic function in response to a plurality of logic signal inputs, and wherein said step of implementing said candidate portion in said auxiliary component comprises the steps of:

determining a value for said logic signal output for each possible combination of said logic signal inputs; and for each possible combination of said logic signal inputs, storing in the data storage location addressed by that combination of said logic signal inputs the value of said logic signal output for that combination of said logic signal inputs.

4. The method defined in claim 1 wherein said auxiliary component has a first number of input terminals and a second number of output terminals, and wherein said step of determining the logic requirements of said candidate portion comprises the steps of:

determining a third number corresponding to how many input terminals said candidate portion requires; and determining a fourth number corresponding to how many output terminals said candidate portion requires.

5. The method defined in claim 4 wherein said comparing step comprises the steps of:

comparing said first number to said third number; and comparing said second number to said fourth number.

6. The method defined in claim 5 wherein said selecting step comprises the step of:

selecting said candidate portion for possible implementation in said auxiliary component only if said third number is less than or equal to said first number and said fourth number is less than or equal to said second number.

7. A method for selecting a portion of a user's logic design for implementation in a component which is auxiliary to programmable logic array integrated circuitry in which a remainder of said user's logic design other than said portion is to be implemented, said method comprising the steps of:

identifying a candidate portion of said user's logic design for possible implementation in said auxiliary component;

determining logic requirements of said candidate portion;

comparing the logic requirements of said candidate portion to logic capabilities of said auxiliary component; and rejecting said candidate portion from possible implementation in said auxiliary component if said logic requirements are not within said logic capabilities, or if said logic requirements are within said logic capabilities, then selecting said candidate portion for possible implementation in said auxiliary component and continuing with the following steps:

determining first resource utilization of said programmable logic array integrated circuitry that results from implementation of said user's logic design in said programmable logic array integrated circuitry;

determining second resource utilization of said programmable logic array integrated circuitry and said auxiliary component that results from implementation of said candidate portion in said auxiliary component and implementation of a balance of said user's logic design other than said candidate portion in said programmable logic array integrated circuitry;

comparing said first and second resource utilizations; and further selecting said candidate portion for possible implementation in said auxiliary component if said first resource utilization is greater than said second resource utilization, or if said first resource utilization is not greater than said second resource utilization, then rejecting said candidate portion from possible implementation in said auxiliary component.

8. The method defined in claim 7 further comprising the steps of, when a candidate portion is selected rather than rejected in said further selecting step:

repeating the first four steps of claim 2 for a second candidate portion of said user's logic which is different from said candidate portion; and if said second candidate portion is selected rather than rejected in the fourth step of claim 2, then repeating at least the last three steps of claim 2 for said second candidate portion; and if said second candidate portion is selected rather than rejected in said further selecting step, then performing the following steps:

comparing said second resource utilization associated with said candidate portion and said second resource utilization associated with said second candidate portion; and still further selecting said candidate portion rather than said second candidate portion for possible implementation in said auxiliary component if said second resource utilization associated with said candidate portion is less than said second resource utilization associated with said second candidate portion, or if said second resource utilization associated with said candidate portion is greater than said second resource utilization associated with said second candidate portion, then still further selecting said second candidate portion rather than said candidate portion for possible implementation in said auxiliary component.

9. The method defined in claim 7 further comprising the step of:

if said candidate portion is selected in said further selecting step, then implementing said candidate portion in said auxiliary component and implementing a balance of said user's logic design other than said candidate portion in said programmable logic array integrated circuitry, or if said candidate portion is rejected in said further selecting step, then implementing said user's logic design in said programmable logic array integrated circuitry.

10. The method defined in claim 9 wherein said auxiliary component includes a RAM having a plurality of data storage locations addressed for data storage and retrieval by signals applied to a plurality of address terminals of said RAM, wherein said candidate portion produces at least one logic signal output in accordance with a predetermined logic function in response to a plurality of logic signal inputs, and wherein said step of implementing said candidate portion in said auxiliary component comprises the steps of:

determining a value for said logic signal output for each possible combination of said logic signal inputs; and for each possible combination of said logic signal inputs, storing in the data storage location addressed by that combination of said logic signal inputs the value of said logic signal output for that combination of said logic signal inputs.

11. The method defined in claim 8 further comprising the steps of:

implementing in said auxiliary component the one of said candidate portion and said second candidate portion which was selected in said still further selecting step and implementing in said programmable logic array integrated circuitry a balance of said user's logic design other than said one of said candidate portion and said second candidate portion.

12. The method defined in claim 11 wherein said auxiliary component includes a RAM having a plurality of data storage locations addressed for data storage and retrieval by signals applied to a plurality of address terminals of said RAM, wherein said one of said candidate portion and said second candidate portion produces at least one logic signal output in accordance with a predetermined logic function in response to a plurality of logic signal inputs, and wherein said implementing step comprises the steps of:

determining a value for said logic signal output for each possible combination of said logic signal inputs; and for each possible combination of said logic signal inputs, storing in the data storage location addressed by that combination of said logic signal inputs the value of said logic signal output for that combination of said logic signal inputs.

13. A method for selecting a portion of a user's logic design for implementation in a component which is auxiliary to programmable logic array integrated circuitry in which a remainder of said user's logic design other than said portion is to be implemented, said auxiliary component having elements which are capable of functioning as registers of predetermined types, said method comprising the steps of:

identifying a candidate portion of said user's logic design for possible implementation in said auxiliary component;

determining logic requirements of said candidate portion by determining whether said candidate portion requires registers, and if so, the required types of the required registers;

comparing the logic requirements of said candidate portion to logic capabilities of said auxiliary component; and selecting said candidate portion for possible implementation in said auxiliary component if said logic requirements are within said logic capabilities, or if said logic requirements are not within said logic capabilities, then rejecting said candidate portion from possible implementation in said auxiliary component.

14. The method defined in claim 13 wherein said comparing step comprises the step of:

comparing said required types of registers to said predetermined types.

15. The method defined in claim 14 wherein said selecting step comprises the step of:

selecting said candidate portion for possible implementation in said auxiliary component only if said required types of registers are among said predetermined types.

* * * * *